(12) United States Patent
Ficke et al.

(10) Patent No.: US 8,237,510 B2
(45) Date of Patent: Aug. 7, 2012

(54) IMPLEMENTING PHASE LOCKED LOOP (PLL) WITH ENHANCED LOCKING CAPABILITY WITH A WIDE RANGE DYNAMIC REFERENCE CLOCK

(75) Inventors: Joel T. Ficke, Bloomer, WI (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 12/858,881

(22) Filed: Aug. 18, 2010

(65) Prior Publication Data

US 2012/0047481 A1    Feb. 23, 2012

(51) Int. Cl.
*H03L 7/085*    (2006.01)
*H03L 7/089*    (2006.01)

(52) U.S. Cl. ............ 331/1 A; 331/17; 331/179; 327/156; 375/376

(58) Field of Classification Search ............... 331/1 A, 331/16, 17, 34, 179; 327/147, 156; 375/373, 375/374, 376
See application file for complete search history.

(56) References Cited

U.S. PATENT DOCUMENTS

| | | | |
|---|---|---|---|
| 4,503,401 A | 3/1985 | Kyriakos et al. | |
| 5,168,245 A | 12/1992 | Koskowich | |
| 5,382,922 A * | 1/1995 | Gersbach et al. | 331/1 A |
| 5,648,744 A | 7/1997 | Prakash et al. | |
| 5,686,864 A * | 11/1997 | Martin et al. | 331/1 A |
| 6,114,920 A | 9/2000 | Moon et al. | |
| 6,275,115 B1 * | 8/2001 | Egawa | 331/11 |
| 6,388,536 B1 | 5/2002 | Welland | |
| 6,661,267 B2 * | 12/2003 | Walker et al. | 327/159 |
| 7,042,277 B2 * | 5/2006 | Cranford et al. | 327/538 |
| 7,046,093 B1 * | 5/2006 | McDonagh et al. | 331/16 |
| 7,092,675 B2 | 8/2006 | Lim et al. | |
| 7,940,128 B2 * | 5/2011 | Machado | 331/16 |
| 7,969,248 B1 * | 6/2011 | Whitten et al. | 331/16 |
| 2005/0007202 A1 | 1/2005 | Su et al. | |
| 2008/0018411 A1 | 1/2008 | Feng et al. | |

* cited by examiner

*Primary Examiner* — Levi Gannon
(74) *Attorney, Agent, or Firm* — Joan Pennington

(57) ABSTRACT

A method and a phase locked loop (PLL) circuit for implementing enhanced locking capability with a wide range dynamic reference clock, and a design structure on which the subject circuit resides are provided. The PLL circuit includes a Voltage Controlled Oscillator (VCO) and a plurality of filter comparators receiving a differential filter VCO control voltage. The plurality of filter comparators comparing the differential filter VCO control voltage values, provides a respective gate enable signal responsive to the compared differential filter VCO control voltage values. A clock signal is applied to an up/down counter responsive to the respective gate enable signal and the wide range dynamic reference clock. The count values of the up/down counter are provided to the VCO to select a respective frequency range for the VCO.

2 Claims, 6 Drawing Sheets

IMPLEMENTING PHASE LOCKED LOOP (PLL) WITH ENHANCED LOCKING CAPABILITY WITH A WIDE RANGE DYNAMIC REFERENCE CLOCK

FIELD OF THE INVENTION

The present invention relates generally to the data processing field, and more particularly, relates to a method and a phase locked loop (PLL) circuit for implementing enhanced locking capability with a wide range dynamic reference clock, and a design structure on which the subject circuit resides.

DESCRIPTION OF THE RELATED ART

Phase locked loop (PLL) circuits are widely used in many different applications. Typically, PLL circuits have a Voltage Controlled Oscillator (VCO) with an operating range with a ratio of 2/1 for a maximum/minimum frequency range. This range is provided for optimal performance.

An additional requirement for some low power systems requires ramping the reference clock to the PLL circuit down by a factor of 4 or 8, for example, from 250 MHz to 62.5 MHz or 31.25 MHz, to lower the system power.

Typically these requirements cause two major problems. The PLL circuit runs out of range and cannot follow the reference clock. The PLL circuit will not deliver the power reduction desired; the system will not stay synchronized and the PLL relock time is long after the reference clock changes.

SUMMARY OF THE INVENTION

Principal aspects of the present invention are to provide a method and a phase locked loop (PLL) circuit for implementing enhanced locking capability with a wide range dynamic reference clock, and a design structure on which the subject circuit resides. Other important aspects of the present invention are to provide such method and circuit substantially without negative effects and that overcome many of the disadvantages of prior art arrangements.

In brief, a method and a phase locked loop (PLL) circuit for implementing enhanced locking capability with a wide range dynamic reference clock, and a design structure on which the subject circuit resides are provided. The PLL circuit includes a Voltage Controlled Oscillator (VCO) and a plurality of filter comparators receiving a differential filter VCO control voltage. The plurality of filter comparators comparing the differential filter VCO control voltage values, provides a respective gate enable signal responsive to the compared differential filter VCO control voltage values. A clock signal is applied to an up/down counter responsive to the respective gate enable signal and the wide range dynamic reference clock. The count values of the up/down counter are provided to the Voltage Controlled Oscillator (VCO) to select a respective frequency range for the VCO.

In accordance with features of the invention, the frequency range of the VCO is selectively controlled so that the PLL maintains lock when the reference clock changes frequency from a normal mode reference clock frequency to a low power mode reference clock frequency, which is substantially less than the normal mode reference clock frequency, and from the low power mode reference clock frequency to the normal mode reference clock frequency.

In accordance with features of the invention, when the reference clock changes frequency from a normal mode reference clock frequency to a low power mode reference clock frequency, a decrement clock signal clocks the counter for selecting a lower frequency band in the VCO while the differential filter VCO control voltage values remains above a respective comparator threshold offset. When the differential filter voltage falls below the respective comparator threshold offset, the clock signal to the counter is shut off.

In accordance with features of the invention, the frequency range of the multiple frequency band VCO is selectively controlled so that the PLL is effectively locked where the wide range dynamic reference clock has a frequency operating range, for example, from 250 MHz to 50 MHz.

In accordance with features of the invention, the wide range reference clock is applied to a frequency divider to provide a divided down reference clock to selectively increment or decrement the up/down counter. The frequency divider has a selected value based upon the reference clock ramp between the normal mode reference clock frequency and the low power mode reference clock frequency. The frequency divider ensures that the counter is clocked at a rate that is appropriate for the ramp rate of the reference clock. The frequency divider provides a counter clock frequency so that the VCO band selection is fast enough to keep up with the reference clock ramp, but slow enough to allow the loop to settle for each frequency band setting.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing an enhanced phase locked loop (PLL), and a design structure on which the subject circuits resides are provided. The circuit provides enhanced locking capability with a wide range dynamic reference clock. The operations are achieved generally by using analog circuits, which results in significantly lower power.

Figure 1A:
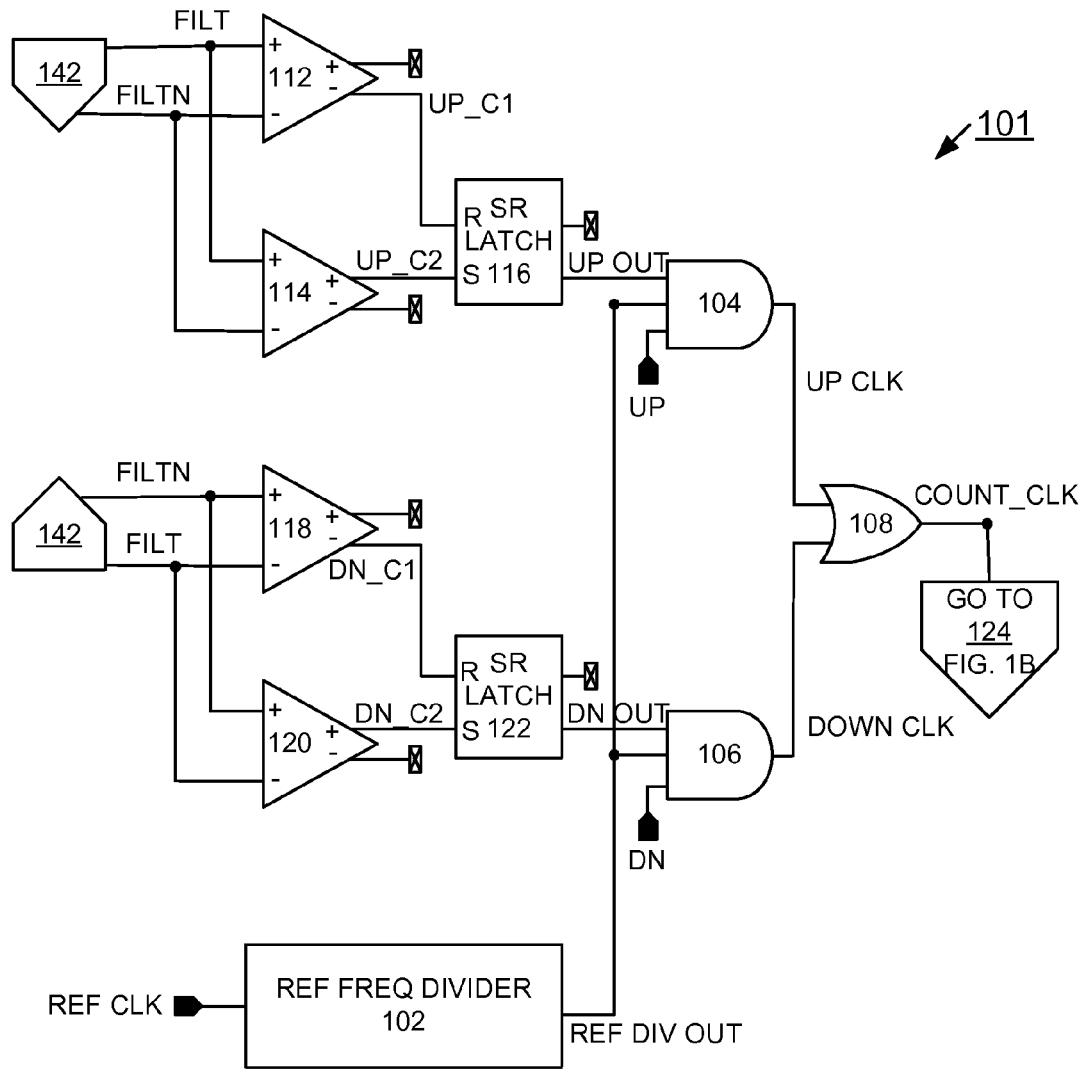
FIGS. 1A, 1B, and 1C together provide a schematic diagram representation of a phase locked loop (PLL) circuit with enhanced locking capability with a wide range dynamic reference clock in accordance with the preferred embodiment.
Figure 1B:
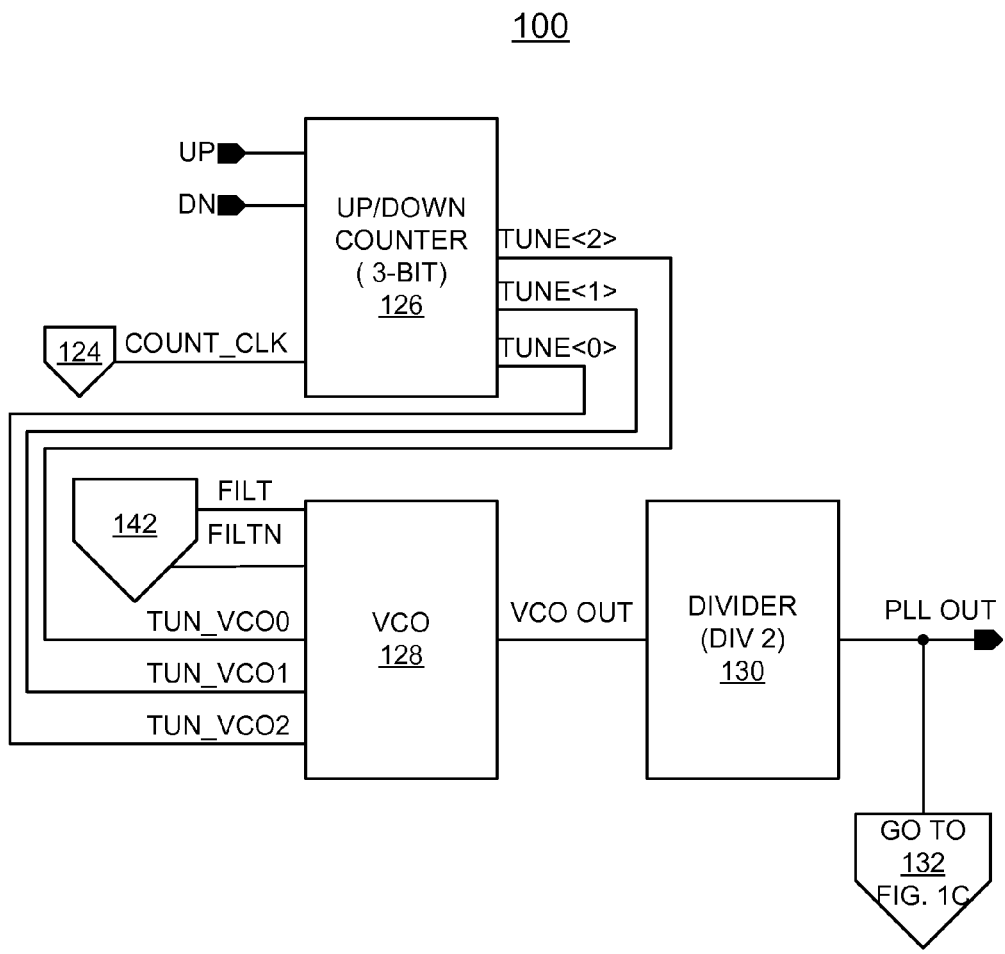
Figure 1C:
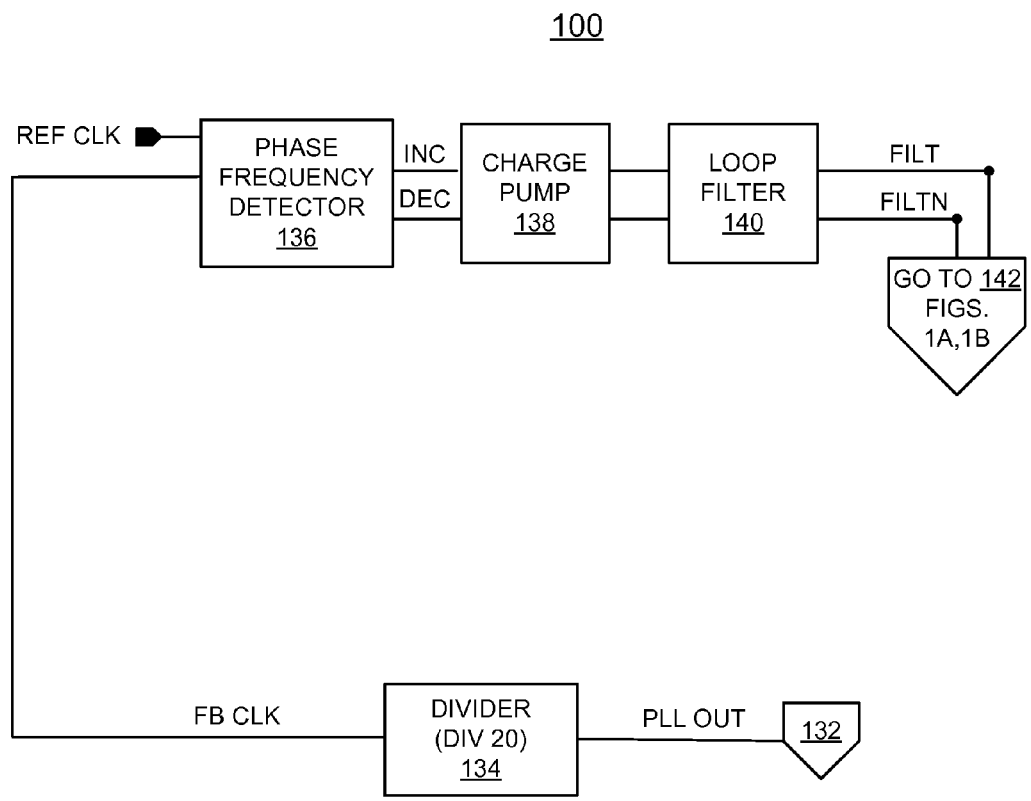

Having reference now to the drawings, in FIGS. 1A, 1B, and 1C, there is shown a phase locked loop (PLL) circuit implementing enhanced locking capability with a wide range dynamic reference clock generally designated by the reference character 100 in accordance with the preferred embodiment.

In accordance with features of the invention, the PLL circuit 100 has enhanced capability and is adapted for use with a wide range dynamic reference clock, for example, having a normal mode reference clock of 250 MHz, and a low power mode reference clock of 50 MHz. A typical PLL can track minor fluctuations in its reference clock frequency provided these changes do not place the operating point beyond the VCO range. However, when the reference clock changes so that the VCO is made to go outside the range, the PLL will unlock.

In accordance with features of the invention, the PLL circuit 100 detects when the VCO is going beyond the range of a current VCO frequency band, and then switches the VCO to a higher or lower VCO frequency band to avoid unlocking.

Referring now to FIG. 1A, the PLL circuit 100 includes a sampling and counter input circuit generally designated by the reference character 101 illustrated in FIG. 1A. The sampling and counter input circuit 101 includes a reference frequency divider 102 receiving a reference clock input REF CLK and providing a reference divided clock output REF DIV OUT. The reference divided clock output REF DIV OUT is applied to a respective input of a pair of AND gates 104, 106 for generating an up clock UP CLK and a down clock DOWN CLK, responsive to an enabling input. An external enable control signal UP is applied to an input of the AND gate 104 when the PLL circuit 100 is returning from a low power mode back to the normal mode. An external enable control signal DN is applied to an input of the AND gate 106 when the PLL circuit 100 is going from the normal mode to the low power mode. The outputs up clock UP CLK and down clock DOWN CLK are applied to a respective input of an OR gate 108, which provides a count clock COUNT CLK output, applied to an input 124 of FIG. 1B.

The sampling and counter input circuit 101 includes a first pair of filter comparators 112, 114 comparing a differential filter voltage FILT and FILTN from an input 142 output from a loop filter shown in FIG. 1C. An input offset for comparator 112 is, for example, 100 mV. An input offset for comparator 114 is, for example, 200 mV. The first pair of filter comparators 112, 114 provide a respective output UP_C1, UP_C2 responsive to the compared differential filter voltage FILT and FILTN, providing a respective input to a Set/Reset (SR) latch 116. The output signal UP_C1 is applied to the reset input of SR latch 116 and the output signal UP_C2 is applied to the set input of SR latch 116. A gate enable latch output UP_OUT of the SR latch 116 is applied to the AND gate 104, responsive to the compared differential filter voltage FILT and FILTN.

The sampling and counter input circuit 101 includes a second pair of filter comparators 118, 120 comparing the differential filter voltage FILTN and FILT. An input offset for comparator 118 is, for example, 100 mV. An input offset for comparator 120 is, for example, 200 mV. The second pair of filter comparators 118, 120 provide a respective output DN_C1, DN_C2 responsive to the compared differential filter voltage FILTN and FILT, providing a respective input to a Set/Reset (SR) latch 122. The output signal DN_C1 is applied to the reset input of SR latch 122 and the output signal DN_C2 is applied to the set input of SR latch 122. A gate enable latch output DN_OUT of the SR latch 122 is applied to the AND gate 106, responsive to the compared differential filter voltage FILTN and FILT.

Referring now to FIG. 1B, the PLL circuit 100 includes an up/down counter 126 receiving count clock COUNT CLK, at the illustrated input 124, from the output of OR gate 108 of FIG. 1A. The up/down counter 126 receives the external enable control signal UP and the external enable control signal DN, also applied to the AND gates 104, 106 of the sampling and counter input circuit 101, which are respectively activated responsive to the PLL circuit 100 is changing between low power and normal modes. The up/down counter 126 is implemented, for example by a 3-bit counter, and provides tuning inputs TUNE<0>, TUNE<1>, and TUNE<2> applied to a multiple frequency band VCO 128 of the PLL circuit 100.

The multiple frequency band VCO 128 is a multiple stage VCO, for example, with variable capacitor values incrementally added through respective transmission gates (not shown) controlled by the tuning inputs. The up/down counter 126 provides tuning inputs to the multiple frequency band VCO 128 to switch tuning bands dynamically and effectively maintaining PLL lock while switching between tuning bands of the VCO 128.

For example, tuning inputs TUNE<0>, TUNE<1>, and TUNE<2 are applied to the multiple frequency band VCO 128 to select multiple center band frequencies Fc as shown in the following Table 1.

TABLE 1

| TUNE [0:2] | Fc |
|---|---|
| 000 | 3 GHz |
| 100 | 4 GHz |
| 010 | 5 GHz |
| 110 | 6 GHz |
| 001 | 7 GHz |
| 101 | 8 GHz |
| 011 | 9 GHz |
| 111 | 10 GHz |

It should be understood that various circuit arrangements can be used to implement the multiple frequency band VCO 128. For example, a conventional five stage VCO, can be used with capacitance incrementally added to the transmission gates of each stage to slow down oscillation frequency and hence extend the VCO range. This variable capacitance can be provided such that with each stage node having four different capacitor values, for example, a capacitive series of 5, 10, 20, and 40 femto-farad (fF) which are switched in through control signals coming from the counter 126.

The up/down counter 126 provides tuning inputs to the multiple frequency band VCO 128 to switch tuning bands dynamically when the wide range dynamic reference clock ramps down. The reference clock COUNT_CLK continues to clock the counter 126, selecting a lower frequency band in the VCO 128 for as long as the differential filter voltage remains above the comparator 120 threshold offset. When an appropriate band has been chosen, the differential filter voltage fall below the comparator 118 threshold offset and the counter 126 will shut off. The output VCO OUT of the VCO 128 is applied to an optional divider 130, such as a divide by 2, which provides an output PLL OUT, which is applied at input 132 in FIG. 1C.

Referring now to FIG. 1C, the PLL circuit 100 includes a divider 134, such as a divide by 20, receiving the output PLL OUT at input 132 and providing a feedback signal output FB CLK. The PLL circuit 100 includes a phase frequency detector 136 receiving the feedback signal output FB CLK of divider 134, and the reference clock input REF CLK, which is applied to the sampling and counter input circuit 101 of FIG. 1A, and providing increment and decrement signals applied to a charge pump 138. The charge pump 138 provides differential signal input to a loop filter 140, which provides the differential loop filter signal voltage FILT and FILTN, applied to the sampling and counter input circuit 101 of FIG. 1A at input 142.

The REF DIV DIVIDER 102 is provided so that the counter 126 is clocked at an appropriate rate for the ramp rate of the reference clock. The frequency divider 102 is provided so that the VCO band selection is fast enough to keep up with the reference clock ramp, but slow enough to allow the loop to settle for each band setting. For example, a divide by value to set for REF DIV divider 102 represented by N, can be identified by:

$$N=(t_1-t_0)/(B*((T_1+T_0)/2))$$

where, $t_0$=start time of reference clock ramp, $t_1$=end time of reference clock ramp, $T_0$=reference clock period at start of ramp (normal mode), $T_1$=reference clock period at end of ramp (low power mode), and B=number of VCO bands. For example, where the reference clock starts at 250 MHz at t=0 and ramps down to 50 MHz by the time that t=1 us. The multiple frequency band VCO 128 has 8 bands. The programmable reference clock divider should be:

N=(1000 ns−0))/(8*((20 ns+4 ns)/2))=10.4 or the REF DIV DIVIDER 102 should be programmed to 10.

Referring now to FIGS. 2A, 2B, 2C, 2D, 2E, 2F, 2G, 2H, there are shown example waveforms illustrating example operations of the PLL circuit 100 in accordance with the preferred embodiment.

Figure 2A:
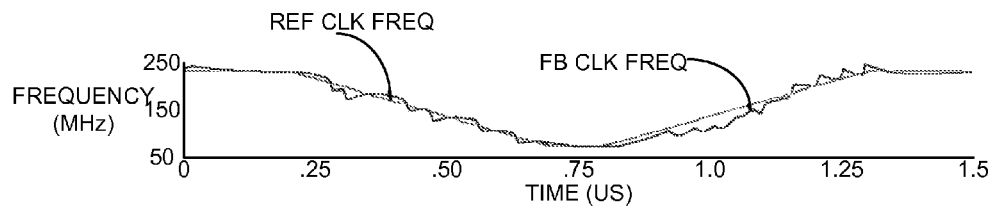
FIGS. 2A, 2B, 2C, 2D, 2E, 2F, 2G, 2H are waveform diagrams illustrating example operation of the circuit of FIG. 1 in accordance with the preferred embodiment.

In FIG. 2A, the reference clock input REF CLK, which is applied to the sampling and counter input circuit 101 of FIG. 1A and the phase frequency detector 136 is illustrated together with the feedback signal FB CLK, applied to the phase frequency detector 136. As shown, initially the reference clock input REF CLK and the feedback signal FB CLK are approximately 250 MHz, for example, during a normal operating mode of the PLL circuit 100. Then the reference clock input REF CLK and the feedback signal FB CLK clock ramp down from normal mode at 250 MHz to low power mode at 50 MHz with the ramp starting at t=0.2 microseconds (μS) and ending at t=0.7 micro-seconds (μS). Then when the mode changes from the low power mode back to the normal mode, the reference clock input REF CLK and the feedback signal FB CLK clock ramp up.

Figure 2B:
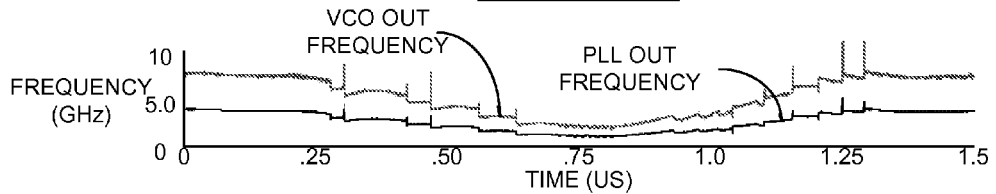

As shown in FIG. 2B, the VCO OUT frequency of the VCO 128 and the PLL OUT frequency of the divider 130 tracks the reference clock input REF CLK. The VCO OUT frequency of the VCO 128 and the PLL OUT frequency of the divider 130 tracks the reference clock that ramps down from 250 MHz to 50 MHz, then ramps back up from 50 MHz to 250 MHz over 0.500 micro-seconds (μS) without requiring a reset.

Figure 2C:
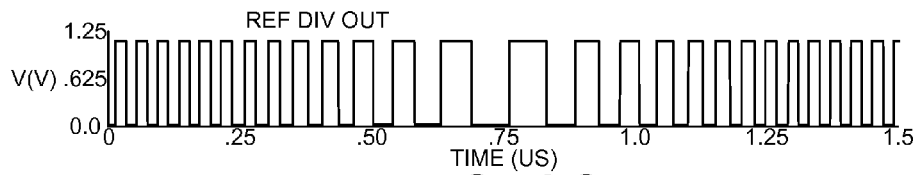

As shown in FIG. 2C, the divided frequency output REF DIV OUT of the REF DIV DIVIDER 102 is illustrated corresponding to the illustrated wide range reference clock input REF CLK shown in FIG. 2A.

Figure 2D:
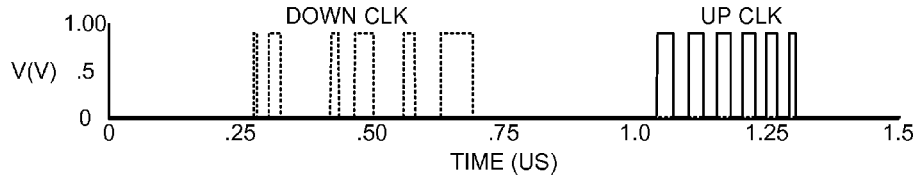
Figure 2E:
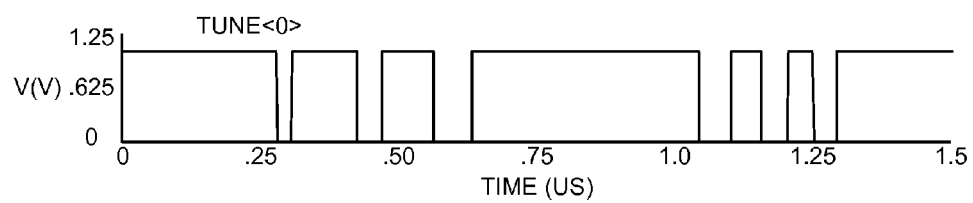
Figure 2F:
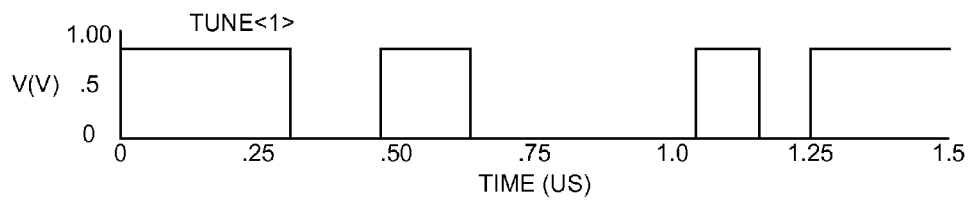
Figure 2G:
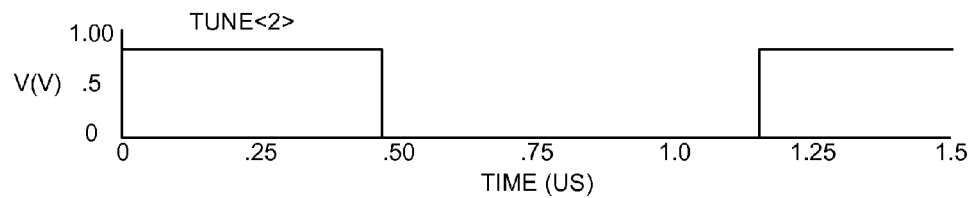

Referring to FIG. 2D, when the differential filter voltage exceeds an input offset threshold set by the comparators 118, 120, and the AND gate 106 is enabled while the reference clock input REF CLK ramps down from the normal mode to the low power mode, a divided down reference clock DOWN CLK is provided to decrement the counter 126. The comparators 112, 114 sense the filter voltages going into the VCO, the AND gate 104 is enabled when the reference clock input REF CLK and the feedback signal FB CLK clock ramp up from the low power mode to the normal mode. Then a divided down reference clock UP CLK is provided to increment the counter 126.

As shown in FIG. 2D, the respective operation of the DN CLK input and UP CLK input that are coupled to the counter 126. The state of the counter 126 is fed directly into the multiple frequency band VCO 128, and the proper band setting is selected by the VCO, responsive to the applied values.

Referring to 2E, 2F, 2G, example tuning inputs TUNE<0>, TUNE<1>, and TUNE<2 are shown that are applied to the multiple frequency band VCO 128 of the PLL circuit 100. Counter tuning inputs 111 are initially provided when the reference clock input REF CLK and the feedback signal FB CLK are approximately 250 MHz, for example, during a normal operating mode of the PLL circuit 100. Then counter tuning inputs 011, 101, 001, 110, 101 are provided the reference clock input REF CLK and the feedback signal FB CLK clock ramp down from normal mode to low power mode with the ramp starting at t=0.2 micro-seconds (μS) and ending at t=0.7 micro-seconds (μS). Then when the mode changes from the low power mode back to the normal mode, the reference clock input REF CLK and the feedback signal FB CLK clock ramp up, and counter values 100, 010, 110, 001, 101, 011, and 111 with the reference clock input REF CLK and the feedback signal FB CLK returned to the normal frequency 250 MHz.

Figure 2H:
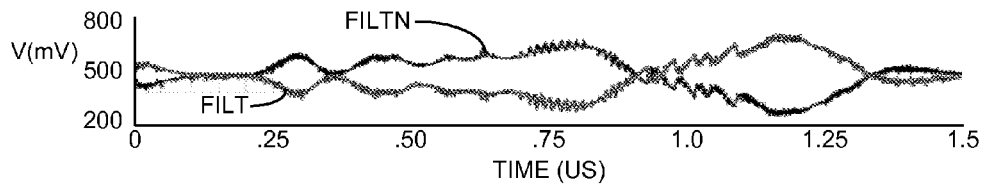

As shown in FIG. 2H, the reference clock slows, the loop attempts to slow and the differential VCO control voltage FILT, FILTN begins to diverge, for example, with changing of the counter tuning inputs from 111 to 011. The differential VCO control voltage FILT, FILTN is monitored and used to lower the PLL range so the system power can be reduced, for example, with the counter tuning inputs changing responsive to the differential VCO control voltage FILT, FILTN as illustrated and described above. When the reference clock is ramping down from the normal mode to the low power mode, the VCO control voltage FILTN is greater than the VCO control voltage FILT. When the reference clock is ramping up from the low power mode to the normal mode, the VCO control voltage FILT is greater than VCO control voltage FILTN.

Figure 3:
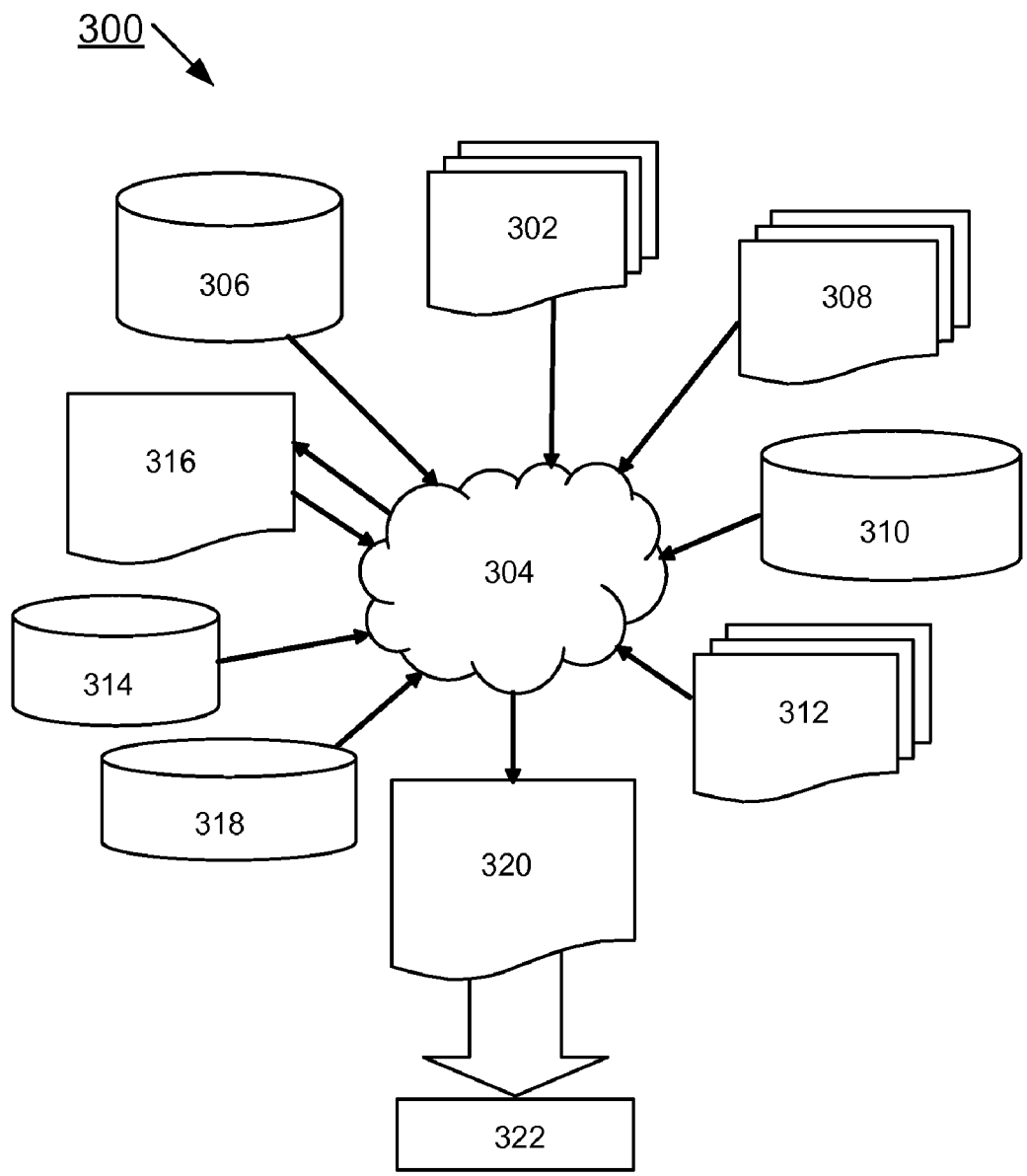
FIG. 3 is a flow diagram of a design process used in semiconductor design, manufacturing, and/or test.

FIG. 3 shows a block diagram of an example design flow 300. Design flow 300 may vary depending on the type of IC being designed. For example, a design flow 300 for building an application specific IC (ASIC) may differ from a design flow 300 for designing a standard component. Design structure 302 is preferably an input to a design process 304 and may come from an IP provider, a core developer, or other design company or may be generated by the operator of the design flow, or from other sources. Design structure 302 comprises circuit 100 in the form of schematics or HDL, a hardware-description language, for example, Verilog, VHDL, C, and the like. Design structure 302 may be contained on one or more machine readable medium. For example, design structure 302 may be a text file or a graphical representation of circuit 100. Design process 304 preferably synthesizes, or translates, circuit 100 into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuits.

Design process 304 may include using a variety of inputs; for example, inputs from library elements 303 which may house a set of commonly used elements, circuits, and devices, including models, layouts, and symbolic representations, for a given manufacturing technology, such as different technology nodes, 32 nm, 45 nm, 90 nm, and the like, design specifications 310, characterization data 312, verification data 314, design rules 316, and test data files 313, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Design process 304 preferably translates an embodiment of the invention as shown in FIGS. 1A, 1B, and 1C along with any additional integrated circuit design or data (if applicable), into a second design structure 320. Design structure 320 resides on a storage medium in a data format used for the exchange of layout data of integrated circuits, for example, information stored in a GDSII (GDS2), GL1, OASIS, or any other suitable format for storing such design structures. Design structure 320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, and 1C. Design structure 320 may then proceed to a stage 322 where, for example, design structure 320 proceeds to tapeout, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A phase locked loop (PLL) circuit for implementing enhanced locking capability with a wide range dynamic reference clock comprising:
   a Voltage Controlled Oscillator (VCO) receiving a differential filter VCO control voltage;
   a plurality of filter comparators comparing the differential filter VCO control voltage values,
   said plurality of filter comparators generating a respective gate enable signal responsive to the compared differential filter VCO control voltage values;
   an up/down counter receiving a clock signal responsive to said respective gate enable signal and the wide range dynamic reference clock; and said up/down counter providing counter values to said VCO for selecting a respective frequency range for the VCO;
   a first latch coupled to a first pair of said filter comparators and a second latch coupled to a second pair of said filter comparators;
   a first AND gate coupled to said first latch receiving said respective gate enable signal, and a second AND gate coupled to said second latch receiving said respective gate enable signal; and
   a frequency divider for dividing a received wide range dynamic reference clock frequency signal and generating a divided reference clock frequency signal, each said first AND gate and said second AND gate receiving divided reference clock frequency signal, and said first AND gate providing an increment clock, and said second AND gate providing a decrement clock.

2. The phase locked loop (PLL) circuit as recited in claim 1 includes an OR gate coupled to said first AND gate and said second AND gate and providing said clock signal applied to said up/down counter.

* * * * *